United States Patent [19]
Lojek et al.

[11] Patent Number: 5,851,892
[45] Date of Patent: Dec. 22, 1998

[54] FABRICATION SEQUENCE EMPLOYING AN OXIDE FORMED WITH MINIMIZED INDUCTED CHARGE AND/OR MAXIMIZED BREAKDOWN VOLTAGE

[75] Inventors: Bohumil Lojek, Round Rock; Joseph M. McRae, Austin, both of Tex.

[73] Assignee: Cypress Semiconductor Corp.

[21] Appl. No.: 852,695

[22] Filed: May 7, 1997

[51] Int. Cl.$^6$ .......................... H01L 21/336; H01L 21/31
[52] U.S. Cl. ............................................ 438/305; 438/770
[58] Field of Search ..................................... 438/305, 307, 438/308, 396, 768, 770, 909, 916, 920

[56] References Cited

U.S. PATENT DOCUMENTS

| | | | |
|---|---|---|---|
| 5,024,962 | 6/1991 | Murray et al. | 437/40 |
| 5,132,244 | 7/1992 | Roy | 437/13 |
| 5,210,056 | 5/1993 | Pong et al. | |
| 5,306,672 | 4/1994 | Numasawa | 437/225 |
| 5,541,141 | 7/1996 | Cho | 437/241 |
| 5,571,734 | 11/1996 | Tseng et al. | 437/40 |
| 5,631,199 | 5/1997 | Park | 438/770 |
| 5,648,282 | 7/1997 | Yoneda | 437/40 |
| 5,650,344 | 7/1997 | Ito et al. | 437/40 |
| 5,683,946 | 11/1997 | Lu et al. | 437/235 |

*Primary Examiner*—John F. Niebling
*Assistant Examiner*—Michael S. Lebentritt
*Attorney, Agent, or Firm*—Kevin L. Daffer; Conley, Rose & Tayon

[57] ABSTRACT

A semiconductor structure is provided having an improved oxide with minimal irregularities and charge trap densities. The oxide is formed by an oxidation process which controls temperature and ambient conditions during oxidation as well as prior to and after oxidation. The ambient conditions are chosen such that the silicon surface is more receptive to growing a high quality, relatively thin oxide. A post-oxidation anneal helps ensure any irregularities, dislocations, contaminants involved in trap formation are minimized after the oxide is grown. A post-oxidation anneal involving oxygen incorporated into the oxide is presumed to help minimize any defects which might result from the pre-existing oxidation cycle. A slow ramping of temperature and close control of that temperature helps minimize trap locations at or near the silicon surface on which oxide will be grown. The combination of pre- and post-oxidation anneal, the ambient chosen, and various cleaning(g steps prior to oxidation helps ensure a high quality gate or tunnel oxide of relatively thin dimension.

21 Claims, 4 Drawing Sheets

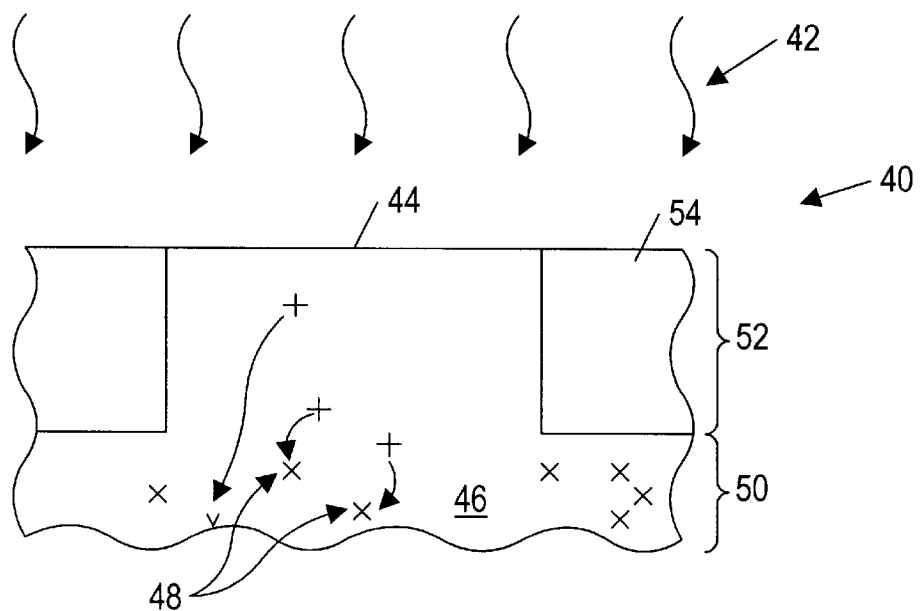
FIG. 4
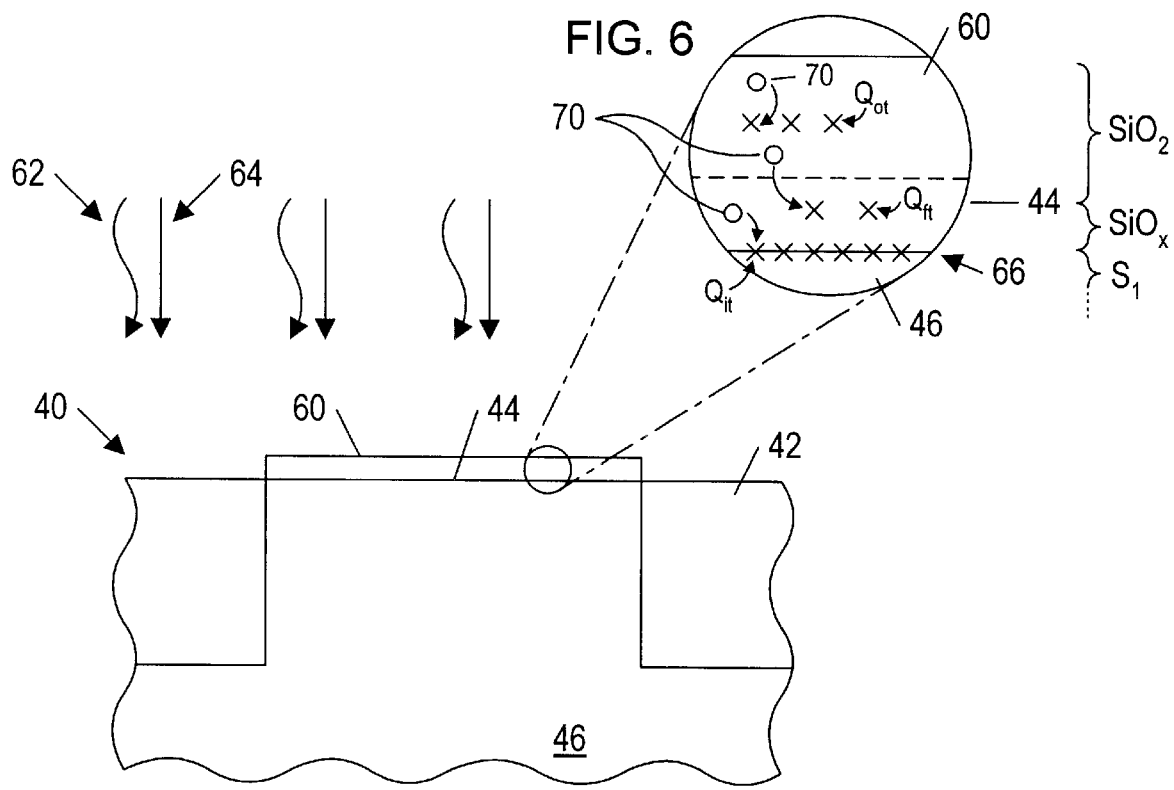
FIG. 6
FIG. 5

FABRICATION SEQUENCE EMPLOYING AN OXIDE FORMED WITH MINIMIZED INDUCTED CHARGE AND/OR MAXIMIZED BREAKDOWN VOLTAGE

BACKGROUND OF THE INVENTION

1. Field of the Invention

This invention relates to integrated circuit fabrication and more particularly to an oxide formed with reduced irregularities and/or trap sites within the oxide and at the oxide-substrate interface, the result of which is a more stable threshold voltage with enhanced oxide breakdown voltage.

2. Description of the Related Art

The formation of stoichiometric and non-stoichiometric silicon dioxide ("oxide") on a silicon surface is generally well known. Oxide is formed either through deposition or by thermal oxidation. In areas where electrical performance is critical, oxide is generally grown using thermal oxidation.

A thermally grown oxide not provides relatively good adherence, or intermingling, between the oxide and the silicon (i.e., passivates the silicon surface), but also presents a superior mask against ion implantation and diffusion therethrough. Thermally grown oxides are therefore a mainstay in the production of MOS transistor gate and/or tunnel oxides. Gate oxides exist between channel areas and corresponding polysilicon gate conductors of a metal oxide semiconductor ("MOS") transistor. The gate oxide can be made relatively thin either entirely across the channel or in a localized region of the channel to encompass a window through which programmed electrons can tunnel. The tunneling window embodies the so-called "tunnel oxide" used in non-volatile and/or electrically programmable memory devices. In order to readily achieve programmability, the tunneling oxide is made generally thinner than gate oxides.

A thermal oxide results from exposing a silicon-based surface to an oxygen-containing ("dry") or steam-containing ("wet") atmosphere or ambient. The oxygen and/or steam react with silicon at elevated temperatures to form the oxide which partially consumes the exposed silicon surface as it grows. The rate at which oxide grows depends upon numerous factors which include, for example, the orientation of the silicon crystal at the growth surface, the concentration of dopants within or at the silicon surface, and whether pressure or plasma is applied to the oxidizing ambient. Regardless of the factors used, irregularities in the thermal oxide naturally occurs. The amount of irregularity has a direct impact on the quality of oxide being produced and, more specifically, the operation of a subsequently formed transistor.

Irregularities in the thermal oxide may arise from irregularities on the silicon surface being oxidized or in the thermal oxidation process itself. For example, the irregularities can be classified as precipitates, dislocations, faults, defects, contaminants, improper bonds, etc., which cause irregular growth in regions proximate to the irregularity, relative to regions distal from the irregularity. An uneven growth pattern may be compounded by additional irregularities formed in the oxide itself. Those irregularities may occur as the oxide accumulates or is derived from the irregularities existing in the consumed, underlying silicon. The former irregularities therefore reside in the silicon lattice, and the latter irregularities exist in the oxide—both of which bring about a disjointed oxide pattern which can lead to "trap sites". The trap sites may bind charged ions (e.g., from contamination) or minority carriers (e.g., from circuit operation). Since the trap sites can occupy or "trap" a charge, the trap sites are sometimes termed "charge trap sites".

Attraction of minority carriers (holes or electrons) which migrate within the oxide or across the silicon-oxide interface is a detrimental result of trap sites. In general, long minority carrier lifetimes are beneficial to transistor operation. For example, long lifetimes in MOS transistors used in DRAMs permit longer retention of charge. The trap sites within the oxide or at the silicon-oxide interface, in combination with localized oxide thinning, cause improper shifts in turn-on voltage threshold ($V_t$) of the ensuing transistor, diode, etc. Trap sites and localized oxide thinning may also reduce the oxide breakdown voltage. Charge accumulates in the localized trap areas when the transistor is biased. Sufficient biasing may cause a breakdown the oxide in or around the trap site.

Attempts have been made to produce a transistor with a more controlled threshold, or one with sufficiently high breakdown voltage. Conventional techniques generally employ an anneal step prior to oxidation and another anneal step after oxidation. The first anneal is used primarily to present a silicon surface which is more conducive to growing a higher quality oxide. This may involve a reduction in irregularities within the silicon surface or the oxide grown adjacent that surface. The second anneal is often used to remove irregularities or trap sites from the grown oxide. The anneal is employed mostly due to the belief that, at sufficiently high temperatures, irregularities will be re-arranged to their proper position and that charge trap sites will be somewhat neutralized with ionic bonds. Accordingly, most conventional oxidation sequences involve a pre-oxidation anneal and a post-oxidation anneal, both of which are carried out at carefully controlled temperatures relative to the interim oxidation step. Prior to and during oxidation, oxygen can flow into the chamber containing the semiconductor topography. After oxidation, however, an ambient is needed which does not promote further oxidation. Nitrogen is a popular inert ambient used during post-oxidation anneal.

Turning to the drawings, FIG. 1 illustrates an example of a conventional sequence used in forming a thermal oxide. As shown, a pre-oxidation anneal occurs at a first temperature during a time indicated by reference numeral 10. Thereafter, the temperature is increased to a higher temperature, wherein oxidation occurs during a time period 12. After oxidation, temperature is further increased to perform post-oxidation anneal during time period 14. Anneal 10 preferably occurs in an inert atmosphere, while anneal 14 occurs exclusively in an inert environment, preferably nitrogen. It is only during oxidation 12 that the inert ambient is interrupted with a flow of oxygen, possibly including hydrogen. Substitution of oxygen requires evacuation of nitrogen from the anneal/oxidation chamber before introducing oxygen. Re-introduction of nitrogen during anneal 14 entails evacuation of oxygen as a pre-cursor to nitrogen flow.

Post-oxidation anneals conducted only in an inert (e.g., nitrogen) atmosphere or ambient cannot in most instances minimize the irregularities and charge)e trap sites arising from the previous oxidation step. Therefore, an improvement is desired to conventional oxide formation sequences. Improvements resulting from modifying the post-oxidation sequence as well as, for example, the pre-oxidation temperature cycle and the cleaning procedures used prior to oxidation would appear beneficial. Such modification is desired to achieve a more stable threshold voltage and/or a maximum breakdown voltage for subsequently formed transistors. As gate and tunnel oxides decrease in thickness to meet, for example, speed and density requirements, it becomes more critical that the pre- and post-oxidation sequences be carried out with an emphasis on irregularity and/or charge trap density reduction. If reduction in irregularity and charge trap density is not achieved, then small geometry transistors may fail in their intended operation.

SUMMARY OF THE INVENTION

The problems outlined above are in large part solved by an improved sequence of forming thermal oxide. The improved sequence involves pre- and post-oxidation anneals occurring under prescribed ambient conditions. Post-oxidation anneal may take place at a higher temperature than the pre-oxidation anneal or the oxidation temperature occurring in the interim. More specifically, the post-oxidation anneal occurs first in an inert atmosphere (or ambient), preferably containing nitrogen, and then in an oxidizing atmosphere (or ambient), preferably containing oxygen. The oxidizing atmosphere may be used during a portion of the post oxidation anneal for a time sufficient to introduce oxygen atoms into the oxide as well as at the oxide-silicon interface. It is postulated that atomic oxygen readily migrates from the oxygen atmosphere to trap sites located within the oxide as well as at the oxide-silicon interface. The oxidizing atmosphere used during post oxidation is therefore any atmosphere which produces trap occupying atoms and, therefore, may be referred to as a "trap neutralizing atmosphere". It is believed the oxygen may migrate to and occupy ("neutralize") the ionic charge at those trap site, thus negating many of the harmful effects on the ensuing transistor performance. It is further believed the oxygen migrates primarily into the oxide and not sufficiently below the oxide which would cause a substantially harmful number of intrinsic gettering sites in the silicon near the channel and/or junction areas. Thus, the amount of thermal energy and oxygen flow rate in the post-oxidation anneal is carefully selected to produce charge neutralization without adding gettering sites to the circuit active areas.

In addition to incorporating an oxidizing agent during post-oxidation anneal, it is further contemplated that the same or dissimilar oxidizing atmosphere be used during a cool down cycle subsequent to post-oxidation anneal. Oxygen, in combination with an inert gas, is used during cooling within the chamber from a relatively high temperature to, e.g., 600° C. The cooling rate may be relatively slow an is performed in the same chamber as that used to effectuate oxidation as well as pre- and post-oxidation anneals. A further cooling is achieved outside the chamber to room temperature. The flow rate of the oxidizing agent during cool down within the chamber preferably occurs throughout the cooling period but is of a lesser flow rate than the oxygen used during a short interim of the post-oxidation anneal. Oxygen applied during post-oxidation anneal and cool down beneficially serves to minimize charge trap sites thereby presenting a higher quality gate or tunnel oxide.

Prior to pre-oxidation anneal, many contaminants and precipitates on the silicon surface are removed by a two-step cleaning procedure possibly in addition to growing a sacrificial oxide. The cleaning procedure preferably involves removing residual organic contaminants, followed by stripping low quality oxide films formed during the removal step. In addition to stripping the low quality oxide, the second cleaning step also removes ionic metals on the silicon surface which could compromise oxide growth in or around those ionic metals. Preferably, the cleaned topography is loaded into a chamber with minimal delay prior to loading. The chamber into which the wafers are loaded may be either a furnace or a rapid thermal anneal ("RTA") chamber. In either instance, pre-oxidation annealing, oxidizing, post-oxidation annealing and cool down are preferably performed without opening the chamber during or between those procedures.

Broadly speaking, the present invention concerns a method for forming an oxide. The method includes oxidizing a silicon-based surface in an oxidizing atmosphere to a first temperature to form an oxidized silicon-based surface. The oxidized, silicon based surface is then heated in an inert atmosphere to a second temperature greater than the first temperature to anneal the oxidized silicon-based surface. An inert atmosphere is any atmosphere which grows minimal oxide on or within a silicon-based surface. While maintaining the second temperature, the inert atmosphere receives or is substituted with an oxygen gas to form an oxidizing atmosphere. Thereafter, the oxidized, silicon-based surface is cooled in the presence of both oxygen and inert gas. The oxidizing atmosphere comprises not only oxygen, but ozone, hydrogen, hydrogen peroxide, silicon dioxide, or possibly hydrogen and chlorine.

The oxide can be formed according to an alternative method beginning with loading a silicon substrate into a chamber containing a flow of nitrogen. The temperature within the chamber is increased from 400° C. to 800° C., preferably 500° C. to 700° C. or more preferably approximately 600° C. Thereafter, the temperature is further increased to approximately 700° C. to 1000° C., preferably above 800° C., and possibly 850° C. at a rate of between 5° C. to 15° C. per minute, preferably at a rate of approximately 7° C. per minute. While maintaining the temperature, the flow of nitrogen is at least partially replaced if not entirely replaced with a first flow of oxygen to convert at least a portion of the silicon substrate to an oxide. The flow of oxygen is then terminated and the inert gas is reestablished while thereafter increasing the temperature within the chamber to approximately 900° C. to 1100° C., and preferably approximately 1000° C. While maintaining the temperature, the inert gas is at least partially terminated and replaced with a flow of oxygen to conclude annealing of the oxide. The temperature within the chamber is then decreased while re-establishing the flow of nitrogen in addition to a third flow of oxygen. Preferably, the first flow of oxygen further comprises a flow of hydrogen or a flow of hydrogen and chlorine. The first flow rate of oxygen is preferably greater than the second flow rate of oxygen, and the second flow rate of oxygen is preferably greater than the third flow rate of oxygen. Prior to loading the silicon substrate into the chamber, the substrate can be cleaned using a two step process. Two step cleaning involves submerging the silicon surface in a solution including $H_2O$—$NH_4OH$—$H_2O_2$. Thereafter, the silicon surface is submerged in a solution including HF—$H_2O$.

Regardless of the methodology used, the present invention also concerns an oxide formed as a result of the present processing sequence. The oxide is embodied as either a gate oxide or a tunnel oxide interposed between respective gate conductors and channel regions, which may be used to form an integrated circuit. The integrated circuit can be partitioned into logic blocks and/or storage media (e.g., memory). The logic blocks may comprise at least one transistor having a gate oxide and the storage media may comprise an electrically programmable transistor having, for example, a tunnel oxide layer.

BRIEF DESCRIPTION OF THE DRAWINGS

Other objects and advantages of the invention will become apparent upon reading the following detailed description and upon reference to the accompanying drawings in which:

FIG. 4 is a partial cross-sectional view of the silicon-based substrate undergoing a pre-oxidation anneal to nucleate trap sites in regions within the substrate bulk below active areas;

FIG. 5 is a partial cross-sectional view of the silicon-based substrate undergoing a post-oxidation anneal in the presence of oxygen to occupy and neutralize trap sites formed within the grown oxide and at the oxide-substrate interface;

FIG. 6 is a detailed view of oxygen segregation and migration toward the trap sites within the grown oxide and at the oxide-substrate interface.

Figure 1:
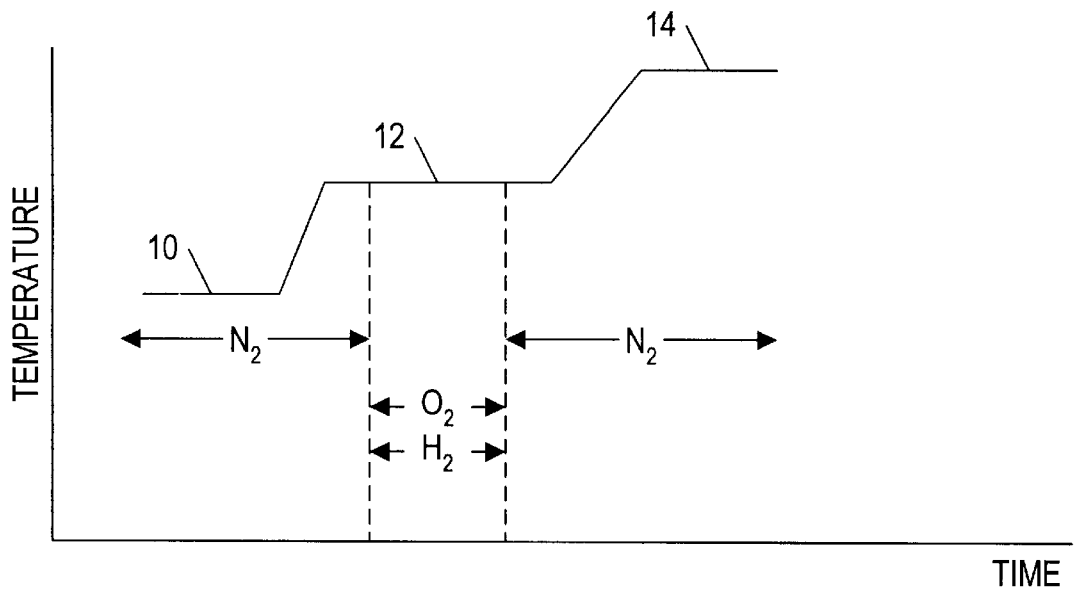
FIG. 1 is a graph of a conventional pre-oxidation, oxidation, and post-oxidation cycles used in forming(g an oxide.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
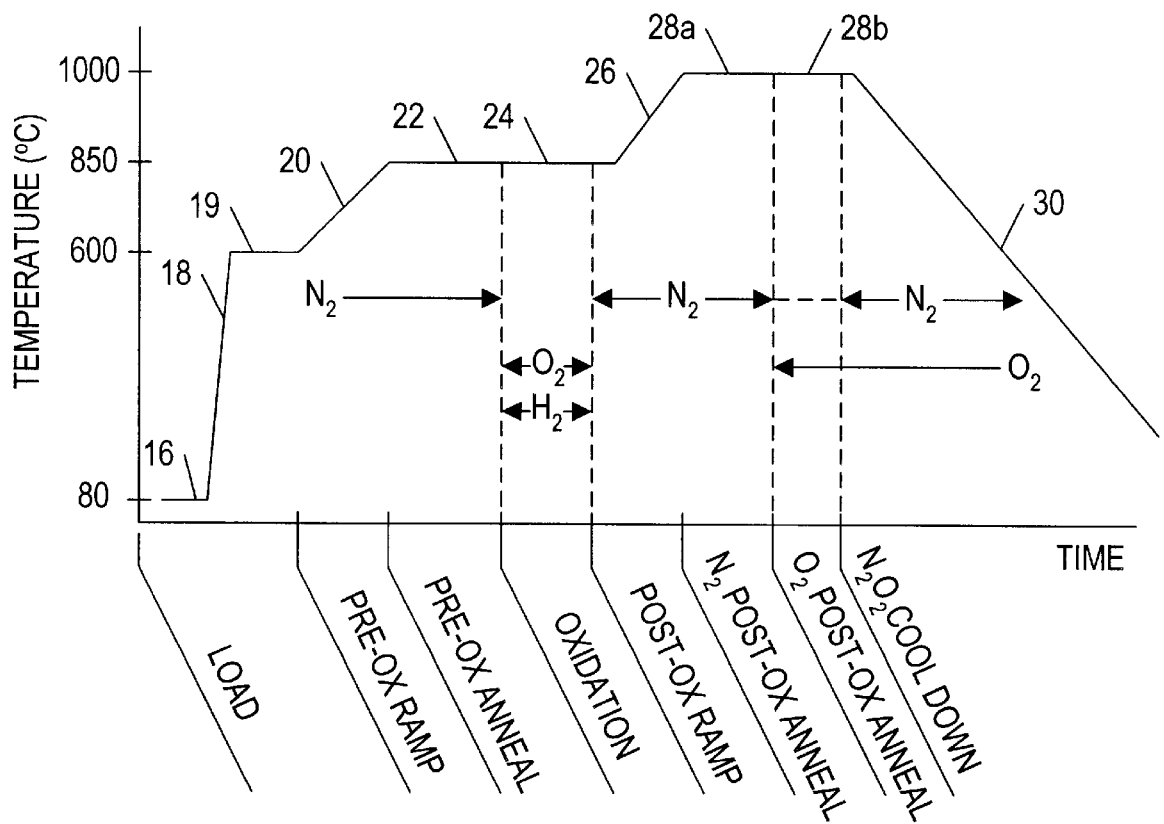
FIG. 2 is a graph of pre-oxidation, oxidation, and post-oxidation cycles used in forming an oxide in accordance with a preferred embodiment of the present invention.

Turning now to the drawings, FIG. 2 depicts pre-oxidation, oxidation and post-oxidation cycles used in forming an oxide hereof. FIG. 2 additionally discloses procedures advantageously used before pre-oxidation anneal and after post-oxidation anneal. To initialize the formation sequence, one or more wafers are loaded into a chamber at time 16. The chamber can either be an RTA chamber or a furnace, and the wafers may have a selectively exposed single crystalline, epitaxial silicon or polysilicon surface. Upon loading the wafers, the chamber is closed and remains closed for the duration shown in FIG. 2. The closed chamber may then be heated from, for example, 10° C. to 100° C. per second, depending upon the type of chamber used, the chamber volume, and the wafer diameter, from a first temperature to a second temperature.

According to the embodiment shown in FIG. 2, the first temperature may be approximately 80° C. and the second temperature may be approximately 600° C. Ramp duration 18 indicates a rate of increase which is relatively rapid, and for example, can exceed 20° C. per minute. In some instances, ramp 18 can exceed 40° C. per minute. Ramp 18 can extend further into a pre-oxidation ramp cycle 20 which occurs at a relatively slow rate of increase. Preferably, ramp 20 occurs at less than 10° C., and preferably occurs at approximately 7° C. per minute. Of course, the rate can vary depending upon the amount of stress differential which can be tolerated at the silicon-oxide interface, and/or the chamber volume or wafer surface area being heated. Ramp 20, according to an alternative embodiment, can occur separate and distinct from ramp 18 via an intermediate, stabilizing step 19. Stabilizing step 19 can be relatively short or long depending upon the quantity of disruption or irregularity within the silicon-based lattice. For example, if disruptions are extensive, then it may desirable to lengthen the duration of stabilizing step 19 and lessen the rate of increase of pre-oxidation ramp 20. This will allow time for nucleation to occur within the bulk of the silicon substrate. As nucleation occurs, oxygen atoms existing within the silicon substrate nucleate or grow at precipitation sites deep within the substrate bulk and away from a denuded zone near the upper surface active areas. The enhanced temperature of pre-oxidation anneal 22 may be partially used for that reason. Anneal 22 helps gather clusters of oxygen atoms by diffusing interstitial oxygen in the substrate bulk toward the nucleated $SiO_x$ clusters. The large volume change associated with precipitation builds a strained field which to some extent "punches out" prismatic dislocation loops. This may form gettering sites which may trap fast diffusing impurities and ionic charges deep within the substrate bulk and away from the pre-existing, denuded silicon substrate surface.

According to a preferred embodiment, pre-oxidation anneal occurs in an inert ambient, a suitable ambient being, e.g., $N_2$, Ar, He, Ne, Kr, Xe, $H_2$ or mixtures thereof. Since oxygen atoms may be present in silicon obtained from the crystalline supplier, the oxygen within the bulk need not be added to the pre-oxidation anneal step. Instead, oxygen is evacuated prior to oxidation 24 since, in fact, oxygen gas is not needed and generally detrimental to performing pre-oxidation anneal or ramp cycles. Therefore, the present method may further comprise one or more cycles of evacuating one or more gas species from the chamber and refilling with an inert gas prior and/or during pre-oxidation annealing.

Oxidation 24 is carried out with nitrogen substantially removed from the chamber and an oxidizing gas introduced, a suitable oxidizing gas being, e.g., $O_2$, $O_3$, $H_2O_2$, $SO_2$, $SO_3$, $H_2O$, HCl, $N_2O$, NO, or mixtures thereof. The oxygen- and hydrogen-bearing gas arises from either a dry oxidizing ambient comprising $O_2$, a dry oxidizing ambient comprising $O_2$ and HCl, or a wet oxidation ambient comprising steam (and possibly HCl). Chlorine has a positive effect on dry oxidation, the improvements being, for example, a reduction of ionic charge movement in the oxide, increase in minority carrier lifetime, and a reduction in oxide irregularities and charge trap sites in the oxide. Chlorine alone, however, cannot pose a significant enough reduction in irregularities and charge trap sites without further enhancements to the steps occurring after oxidation.

Subsequent to oxidation 24, is a post-oxidation ramp cycle 26. Ramp 26 involves an increase in temperature from the oxidation temperature to a post oxidation anneal temperature. According to a preferred embodiment, the oxidation temperature may be approximately 850° C. and post-oxidation anneal may occurs at approximately 1000° C.

Ramp 26 further involves evacuating oxygen, hydrogen and/or chlorine gas from the chamber and re-introducing an inert gas, such as nitrogen. The rate of increase of ramp 26 may be significantly greater than the rate involved in ramp 20. Preferably, the rate of increase of ramp 26 is greater than 5° C. per minute but less than, for example, 20° C. per minute. Subsequent to ramp 26, a post-oxidation anneal 28 occurs. Anneal 28 is carried forth in two stages denoted as reference numerals 28a and 28b, both encompassing the same anneal temperature. First stage 28a utilizes only an inert ambient, whereas the second stage 28b utilizes either exclusively oxygen or both oxygen and nitrogen in the ambient. Regardless of whether nitrogen is present, the oxygen flow rate involved in stage 28b is relatively large, and in some instances, can exceed 2000 sccm, or 20 liters of oxygen within the chamber. The flow rate can vary depending on the chamber volume and wafer surface area provided, however, the flow rate does not cause uneven oxide growth across the previously formed oxide. Second stage 28b occurs for a relatively short period of time, for example, less than 30 seconds to effectuate incorporation of oxygen atoms into the oxide grown during oxidation 24.

The flow rate and volume of oxygen used during post-oxidation anneal 28b can be varied depending upon the quantity or density of oxygen atoms needed within the thermal oxide. The density needed varies depending on the numbers of irregularities or trap sites formed within the oxide during oxidation 24. Thus, the flow rates and quantities described are presented as an example around which oxygenation can vary depending upon a desired performance outcome.

Subsequent to post-oxidation anneal 28b, a cool down cycle 30 occurs. Cool down 30 serves to decrease the temperature within the chamber, and uses a combination of nitrogen and oxygen gas within the chamber. The volume and flow rate of oxygen during cool down 30 is significantly lower than that during post-oxidation anneal 28b. According to one embodiment, the volume of oxygen during cool down 30 is less than 0.1 of the oxygen used during post-oxidation anneal 28b. The addition of oxygen during anneal 28b and cool down 30 will add to the thickness of oxide growing during oxidation 24. The added amount is believed to be less than approximately 20 angstroms. The present sequence compensates for the added back-end oxidation by possibly lowering the duration of oxidation cycle 24. The additional oxide thickness is, however, a necessary byproduct of incorporating oxygen into the oxide bulk for the benefit of improving electrical performance.

Figure 3:
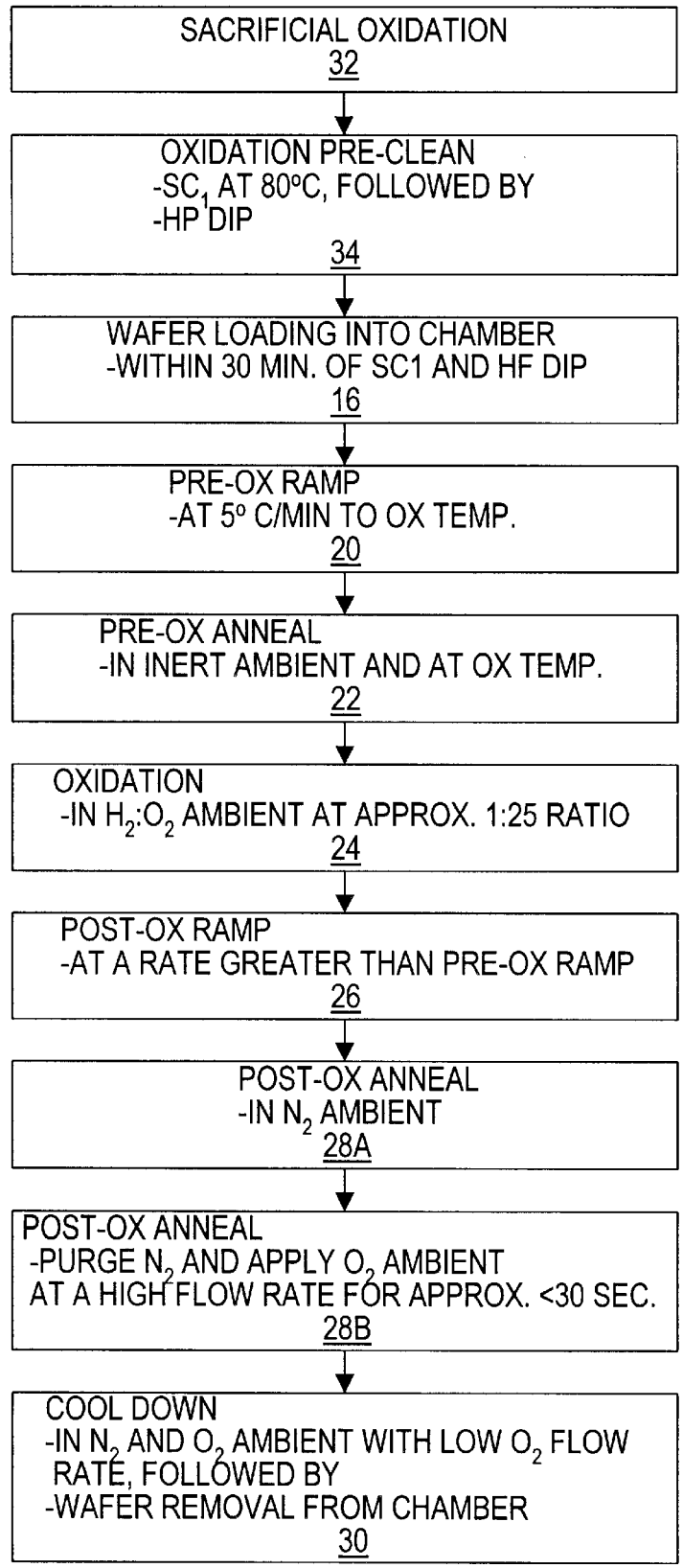
FIG. 3 is flow diagram of an exemplary processing sequence and various parameters used in preparing, annealing, oxidizing and cooling a silicon-based substrate surface.

FIG. 3 depicts in further detail several of the processing steps shown in FIG. 2. Like reference numerals will be provided to steps which are consistent with those shown in FIG. 2 for sake of consistency and clarity. Additional processing steps, however, are shown in FIG. 3 and will be accorded additional reference numerals. FIG. 3 illustrates a fabrication sequence, and parameters involved in that sequence, above and beyond those shown in FIG. 2. For example, it is necessary that the silicon surface be prepared prior to loading it into the anneal/oxidizing chamber. Preparation steps involve growing a sacrificial oxide and then removing that sacrificial oxide in step 32. Sacrificial oxidation serves to remove impurities formed on the silicon surface by consuming, that surface with the grown oxide.

In addition to, or in lieu of sacrificial oxidation 32, a pre-clean sequence 34 may take place. Sequence 34 is preferably a two-step sequence involving an alkaline cleaning solution, $SC_1$, followed by a HF cleaning solution. The $SC_1$ solution comprises, for example, $H_2O$—$NH_4OH$—$H_2O_2$ at a ratio of 7:0.15:3. The solution may be heated to approximately 80° C., and the silicon surface may be submerged in the solution for approximately 10–15 minutes. The wafers are rinsed in deionized water after exposure to the $SC_1$ solution. Then, the wafers may be submerged for approximately 15 seconds in a mixture of HF—$H_2O$. The ratio HF:$H_2O$ may be chosen at approximately 1:10 to approximately 1:100. The $SC_1$ solution serves to remove residual organic contaminants and alkaline materials formed on the silicon surface. Unfortunately, the $SC_1$ solution may produce ionic contaminants (e.g., iron and aluminum) from within the solution as well as chemical oxide, possibly in the form of a hydrous oxide byproduct. The HF solution removes hydrous oxide and the ionic contaminants associated with hydrous oxide so that the silicon surface has a controlled amount of contaminants or is relatively neutral prior to oxidation. This is necessary to ensure a controlled amount of charge at or near the silicon surface. In this fashion, whatever charge density occurs at the surface post clean can be moved deeper within the substrate during pre-oxidation anneal.

After cleaning the silicon surface, the wafer embodying the silicon surface is loaded into the anneal/oxidation chamber at step 16. Preferably, loading occurs within 30 minutes of the $SC_1$ and HF dip steps 34. After the temperature within the chamber is increased dramatically, it must again be increased to a pre-oxidation anneal temperature. The latter temperature increase is known as the pre-oxidation ramp cycle 20, which occurs at a relatively slow rate of less than, e.g., 10° C. per minute, and preferably approximately 7° C. per minute. Once pre-oxidation anneal temperatures are achieved, anneal is carried forth immediately preceding oxidation. Anneal cycle 22 occurs in an inert ambient and at oxidation temperature. Oxidation 24 occurs in a $H_2/O_2$ ratio which may be approximately 0.5 to 1.25. Subsequent to oxidation, temperature within the chamber is again increased to a post-oxidation anneal temperature, as shown by reference numerals 28a and 28b. According to one embodiment, nitrogen gas is purged and an oxygen gas is substituted for a duration less than or equal to 30 seconds. Alternatively, nitrogen may be maintained but at a lesser flow rate while oxygen is applied. After post-oxidation anneal 28, temperature is decreased during a cool down cycle 30. Cool down extends to a temperature at or near room temperature so that the wafers can then be removed from the chamber and placed in an atmospheric environment.

Referring to FIG. 4, a partial cross-sectional view of a semiconductor topography 40 is shown. Topography 40 includes field regions which surrounds an active region. The field regions are occupied by a field dielectric 42, and the active region comprise a silicon surface 44. Existing within silicon substrates 46 are gettering sites 48. Gettering sites 48 are often termed intrinsic gettering sites which, according to one popular design, are irregularities derived from migratory oxygen atoms pre-existing within the bulk of substrate 46 prior to any processing thereof. Gettering sites 48 occur within bulk regions 50 of substrate 46. This is due to surface regions 52 being denuded of sites 48. Nucleation, precipitation and denudation generally occur as a three-step sequence needed to place gettering sites 48 deep within bulk areas 50 and away from active regions near surface 44.

Exposing substrate 46 to a pre-oxidation anneal, such as that shown as reference numeral 22 in FIGS. 2 and 3, reduces thermal energy 54 applied to substrate 46. Thermal energy 54 is chosen at a magnitude sufficient to move metallic contaminants 56 arising from pre-process oxidation steps. Thermal energy drives contaminants 56 deep within the bulk to the gettering sites 48 where they combine and maintain their positions at those sites. Importantly, pre-oxidation anneal proves beneficial in removing silicon-based charges from surface 44, and placing those charges in regions where they will not harm relatively shallow junctions, channels, and especially the oxide residing upon the channels.

FIG. 5 depicts topography 40 subsequent to the step of FIG. 4. Specifically, topography 40 in FIG. 5 includes an oxide 60 formed during oxidation step 24 (shown in FIGS. 2 and 3). Thermal oxide 60 grows only on the exposed silicon surface 44, between field oxide regions 42. It is noted that field oxide 24 comprises a dielectric, preferably soxide formed either by a shallow trench isolation ("STI") process or the well-known LOCOS process. FIG. 5 specifically shows post-oxidation anneal in the presence of an oxygen gas. As such, thermal energy 62 is applied concurrent with oxygen atoms 64. The combination of thermal energy 62 and oxygen 64 causes a slight increase in the thickness of oxide 60 but, more importantly, incorporates oxygen atoms into oxide 60 and at the interface between oxide 60 and silicon substrate 46.

FIG. 6 is a detailed view of oxide 60 and the oxide-silicon interface at a localized region shown in FIG. 5. Specifically, FIG. 6 illustrates a mechanism by which oxygen atoms incorporated during post-oxidation anneal 28b move to and occupy irregularities and charge traps within oxide 60 and at the oxide-silicon interface 66. Illustrated are various charge trap sites, the nomenclature thereof being directed to the position of those sites within regions 60 and 66. As henceforth noted, the trap sites can include irregularities which may or may not be charged. At region 66 are trap sites referred to as interface trap sites $Q_{it}$. Sites $Q_{it}$ occur at the oxide-silicon interface. $Q_{it}$ occurs primarily as a result of dangling bonds, often referred to as interfacial trap locations at the oxide-silicon interface. Dangling bonds result primarily from sporadic silicon-to-oxide atomic bonds which readily accept mobile carriers (electrons or holes) at the interface. $Q_{it}$ oftentimes changes with gate bias if the interface trap is moved past the Fermi level, causing its occupancy to change. The density of $Q_{it}$ is directly proportional to the propensity of dangling bonds or trap sites located at the silicon-oxide interface. In addition to interfacial trap sites $Q_{it}$ fixed trap sites $Q_{ft}$ also occur during oxide formation. $Q_{ft}$ occur generally between 30 to 35 angstroms into the oxide from the silicon-oxide interface. $Q_{ft}$ remains as predominantly positive fixed charge centered primarily in the so-called interface region of $SiO_x$. In addition to $Q_{it}$ and $Q_{ft}$, oxide trap sites $Q_{ot}$ occur within the silicon dioxide $SiO_2$ material. $Q_{ot}$ are associated with irregularities in oxide 60, classified as, e.g., impurities, contaminants, point defects, area defects, and broken bonds. Trap sites $Q_{ot}$ become charged if avalanche injection of highly energetic ("hot carriers") are forwarded into oxide 60. Another way traps $Q_{ot}$ can become charged is through tunneling associated with non-volatile memory program and erase techniques. Regardless of how the various trap sites can be charged, it is necessary to minimize their propensity for being charged.

Without being bound to theory, it is believed that introduction of oxygen during post-oxidation anneal serves to migrate, occupy and substantially neutralize many of the charge sites $Q_{ot}$, $Q_{ft}$ and $Q_{it}$. FIG. 6 depicts migration of oxygen atoms 70 to the various trap sites to reduce the overall trap density and, accordingly, the charge density within the oxide stoichiometric and non-stochiometric regions, as well as at the oxide-silicon interface.

The desire to minimize trap sites and therefore minimize charge density is evident partly in the need to reduce flat band voltage skews and, more importantly, changes in threshold voltage from the ideal, specified threshold amount. Generally speaking, circuit design assumes a uniform and controlled threshold voltage across all devices involved in an integrated circuit. If the threshold voltage skews, then deleterious changes in operating speed, propagation delay, and subthreshold currents may exist. Yet further, presence of substantial trap sites and charge density within the oxide or oxide interface will increase the source/drain leakage current and, more importantly, will decrease the breakdown voltage of the oxide.

Figure 7:
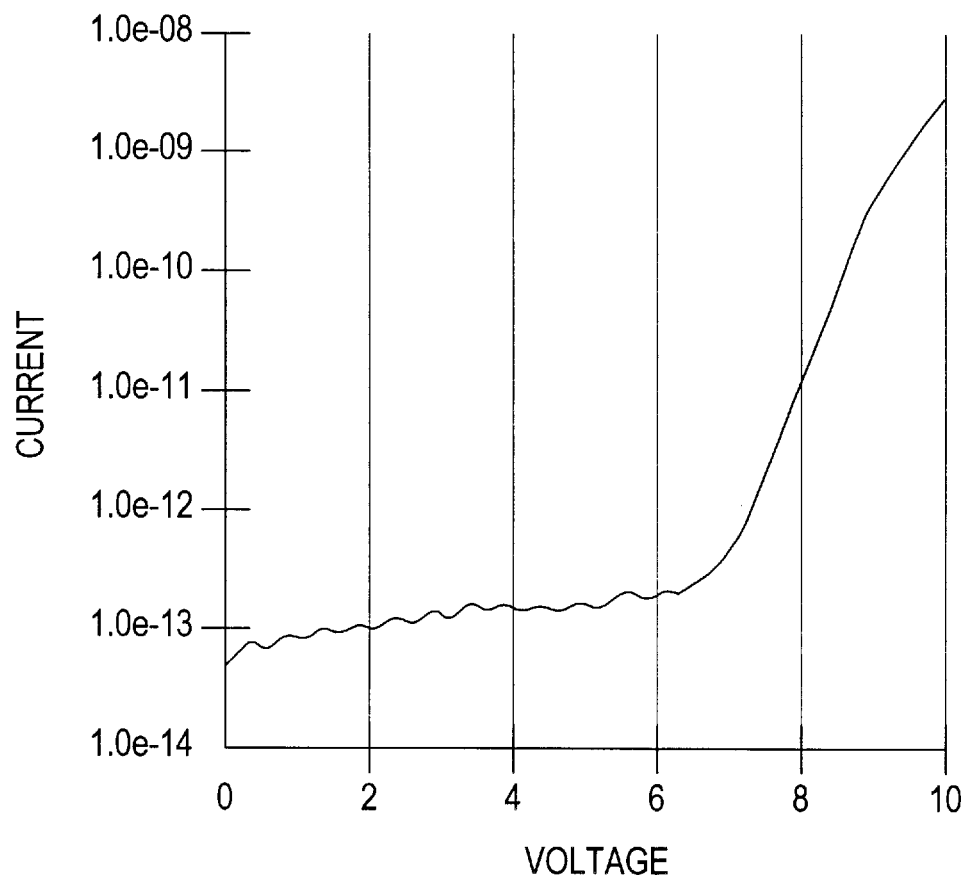
FIG. 7 is a graph of current verses voltage, indicative of breakdown voltage plotted as a function of current applied to an oxide prepared by a preferred embodiment of the present process.

FIG. 7 depicts I-V characteristics of an oxide derived from the present process sequence. Voltage is applied across a gate dielectric of approximately 100 angstroms, and the voltage is increased at approximately 0.5 volts per second. Illustrated in FIG. 7 is a relatively small current up to a voltage of approximately 8 volts. The small current is characterized as leakage current of approximately $1 \times 10^{-13}$ amperes through the oxide. A sudden increase in current does not occur until after approximately 10 volts, and preferably between 11 volts and 15 volts, indicative of a rather large breakdown voltage.

Thus, the I-V graph indicates a relatively small leakage current and substantially large breakdown voltage when oxides are prepared having oxygen flow incorporated into the post-oxidation anneal cycle. Breakdown voltage may appear to also be increased due to a cool down cycle involving oxygen as well as a slow temperature increase during pre-oxidation ramp cycle. Still further, enhanced breakdown voltage may be due to a more thorough pre-oxidation clean sequence involving the present two steps. The latter cleaning step of the two being that used to remove ionic contaminants formed as a result of the preceding cleaning step. Thus, the combination of various factors serve to minimize charge density, trap sites and irregularities prior to, during and after thermal oxidation to achieve the electrical performance enhancements described herein and set forth in FIG. 7.

It will be appreciated to those skilled in the art having the benefit of this disclosure that this invention is believed applicable to any MOS-processed circuit having a thermally grown oxide. Furthermore, it is also to be understood that the form of the invention shown and described is to be taken as exemplary, presently preferred embodiments. In many instances, the present process is most suited for growth of critical oxides, such as gate oxides or tunnel oxides which are quite thin. It is important to utilize the present process to substantially eliminate any and all irregularities, disparities, dislocations, disruptions, etc., not only within the silicon lattice near the silicon surface, but also within the oxide thermally grown thereon. Reduction in such sites appears to provide beneficial electrical results. The specification and drawings are to be regarded in an illustrative rather than a restrictive sense.

What is claimed is:

1. A method for forming an oxide, comprising:

heating a silicon-based surface at a first temperature in the presence of an oxidizing atmosphere to form an oxidized, silicon-based surface;

heating the oxidized, silicon-based surface at a second temperature in an inert atmosphere anid at a temperature sufficient to anneal the oxidized, silicon-based surface, wherein the second temperature is greater than the first temperature;

introducing an oxidizing agent into said inert atmosphere while maintaining said second temperature; and cooling the oxidized, silicon-based surface in the presence of both said inert atmosphere and said oxidizing agent.

2. The method as recited in claim 1, wherein said oxidizing agent comprises hydrogen gas and oxygen gas.

3. The method as recited in claim 2, wherein said oxidizing agent further comprises chlorine gas.

4. The method as recited in claim 1, wherein said oxidized, silicon-based surface comprises a plurality of trap sites substantially occupied by oxygen atoms derived from the flowing oxygen gas.

5. The method as recited in claim 4, wherein said trap sites occur primarily at an interface between the silicon-based surface and the oxidized, silicon-based surface.

6. The method as recited in claim 1, wherein said cooling comprises reducing the second temperature to a third temperature less than the first or second temperatures.

7. The method as recited in claim 1, wherein said introducing comprises flowing oxygen gas at a first flow rate.

8. The method as recited in claim 7, wherein said cooling further comprises flowing oxygen gas at a second flow rate greater than the first flow rate.

9. The method as recited in claim 1, wherein said annealing comprises interrupting the nitrogen with the flowing oxygen gas.

10. The method as recited in claim 9, wherein said interrupting comprises substituting the flowing oxygen gas for substantially all of the nitrogen gas.

11. The method as recited in claim 1, wherein said oxidized, silicon-based surface comprises a gate oxide of an MOS transistor.

12. The method as recited in claim 1, wherein said oxidized, silicon-based surface comprises an electron tunneling oxide of a non-volatile MOS transistor.

13. An oxide formed by the method recited in claim 1.

14. The method as recited in claim 1, wherein each of the heating steps is conducted in a furnace.

15. The method as recited in claim 1, wherein each of the heating steps is conducted in a rapid thermal anneal (RTA) chamber.

16. The method as recited in claim 1, wherein said introducing is conductor for a length of time sufficient to further oxidize the oxidized, silicon-based surface.

17. The method as recited in claim 1, wherein said introducing is conducted for a duration of time less than approximately 30 seconds.

18. The method as recited in claim 1, wherein said oxide comprises a gate oxide of an MOS transistor or tunnel oxide of a non-volatile MOS transistor.

19. The method as recited in claim 1, wherein said first temperature is from 400° C. to 800° C.

20. The method as recited in claim 1, wherein said second temperature is greater than 800° C.

21. The method as recited in claim 1, wherein the second temperature is less than the melting temperature of either the silicon-based surface or the oxidized, silicon-based surface.

* * * * *

UNITED STATES PATENT AND TRADEMARK OFFICE
CERTIFICATE OF CORRECTION

PATENT NO. : 5,851,892

DATED : December 22, 1998

INVENTOR(S) : Lojek et al.

It is certified that error appears in the above-identified patent and that said Letters Patent is hereby corrected as shown below:

Claim 1, col. 10, line 49, after "an inert atmosphere" please delete "anid" and substitute therefor --and--.

Signed and Sealed this

Eleventh Day of May, 1999

Attest:

Q. TODD DICKINSON

*Attesting Officer*    Acting Commissioner of Patents and Trademarks